United States Patent
Kojima et al.

(10) Patent No.: US 8,692,204 B2
(45) Date of Patent: Apr. 8, 2014

(54) APPARATUS AND METHODS FOR ELECTRON BEAM DETECTION

(75) Inventors: Shinichi Kojima, Cupertino, CA (US); Christopher F. Bevis, Los Gatos, CA (US); Joseph Maurino, San Mateo, CA (US); William M. Tong, San Francisco, CA (US)

(73) Assignee: KLA-Tencor Corporation, Milpitas, CA (US)

(*) Notice: Subject to any disclaimer, the term of this patent is extended or adjusted under 35 U.S.C. 154(b) by 171 days.

(21) Appl. No.: 13/453,902

(22) Filed: Apr. 23, 2012

(65) Prior Publication Data
US 2012/0273686 A1 Nov. 1, 2012

Related U.S. Application Data

(60) Provisional application No. 61/479,023, filed on Apr. 26, 2011.

(51) Int. Cl.
*G01T 1/20* (2006.01)

(52) U.S. Cl.
USPC ..... 250/362; 250/483.1; 250/368; 250/336.1; 250/395; 250/473.1

(58) Field of Classification Search
USPC ......... 250/362, 483.1, 368, 473.1, 336.1, 395
See application file for complete search history.

(56) References Cited

U.S. PATENT DOCUMENTS

| | | | | |
|---|---|---|---|---|
| 4,177,379 | A * | 12/1979 | Furukawa et al. | 250/306 |
| 4,760,265 | A * | 7/1988 | Yoshida et al. | 250/492.2 |
| 5,892,230 | A * | 4/1999 | Goodberlet et al. | 250/361 R |
| 6,005,250 | A | 12/1999 | Stickel et al. | |
| 6,207,962 | B1 | 3/2001 | Okino | |
| 6,218,674 | B1 | 4/2001 | Oshino | |
| 6,243,348 | B1 * | 6/2001 | Goodberlet | 369/101 |
| 6,362,489 | B2 | 3/2002 | Okino | |
| 6,403,971 | B1 | 6/2002 | Kawata | |
| 6,521,900 | B1 | 2/2003 | Hirayanagi | |
| 6,529,463 | B1 * | 3/2003 | Goodberlet | 369/109.02 |
| 6,573,514 | B2 | 6/2003 | Gordon et al. | |
| 6,636,297 | B2 * | 10/2003 | Wakabayashi et al. | 356/51 |
| 6,841,402 | B1 | 1/2005 | Hirayanagi | |
| 8,072,615 | B2 * | 12/2011 | Musa et al. | 356/620 |
| 2011/0194092 | A1 * | 8/2011 | Smilde et al. | 355/67 |

* cited by examiner

*Primary Examiner* — David Porta
*Assistant Examiner* — Taeho Jo
(74) *Attorney, Agent, or Firm* — Okamoto & Benedicto LLP (57) ABSTRACT

One embodiment disclosed relates a method of detecting a patterned electron beam. The patterned electron beam is focused onto a grating with a pattern that has a same pitch as the patterned electron beam. Electrons of the patterned electron beam that pass through the grating un-scattered are detected. Another embodiment relates to focusing the patterned electron beam onto a grating with a pattern that has a second pitch that is different than a first pitch of the patterned electron beam. Electrons of the patterned electron beam that pass through the grating form a Moiré pattern that is detected using a position-sensitive detector. Other embodiments, aspects and features are also disclosed.

20 Claims, 6 Drawing Sheets

APPARATUS AND METHODS FOR ELECTRON BEAM DETECTION

CROSS-REFERENCE TO RELATED APPLICATION(S)

The present application claims the benefit of U.S. provisional patent application No. 61/479,023, filed Apr. 26, 2011, by inventors Shinichi Kojima et al., the disclosure of which is hereby incorporated by reference in its entirety.

BACKGROUND OF THE INVENTION

1. Field of the Invention

The present invention relates generally to electron beam detection apparatus and methods of using same.

2. Description of the Background Art

Electron beam instruments include tools used in automated inspection and review of manufactured substrates, electron beam lithography systems, and other instruments that use electron beam technology. Electron beam instruments often utilize an apparatus to detect the position of an electron beam and also to measure various characteristics of the electron beam.

SUMMARY

One embodiment disclosed relates a method of detecting a patterned electron beam. The patterned electron beam is focused onto a grating with a pattern that has a same pitch as the patterned electron beam. Electrons of the patterned electron beam that pass through the grating un-scattered are detected.

In another embodiment, the patterned electron beam is focused onto a grating with a pattern that has a second pitch that is different than a first pitch of the patterned electron beam. Electrons of the patterned electron beam that pass through the grating form a Moiré pattern that is detected using a position-sensitive detector.

Other embodiments, aspects and features are also disclosed.

DETAILED DESCRIPTION

Figure 1:
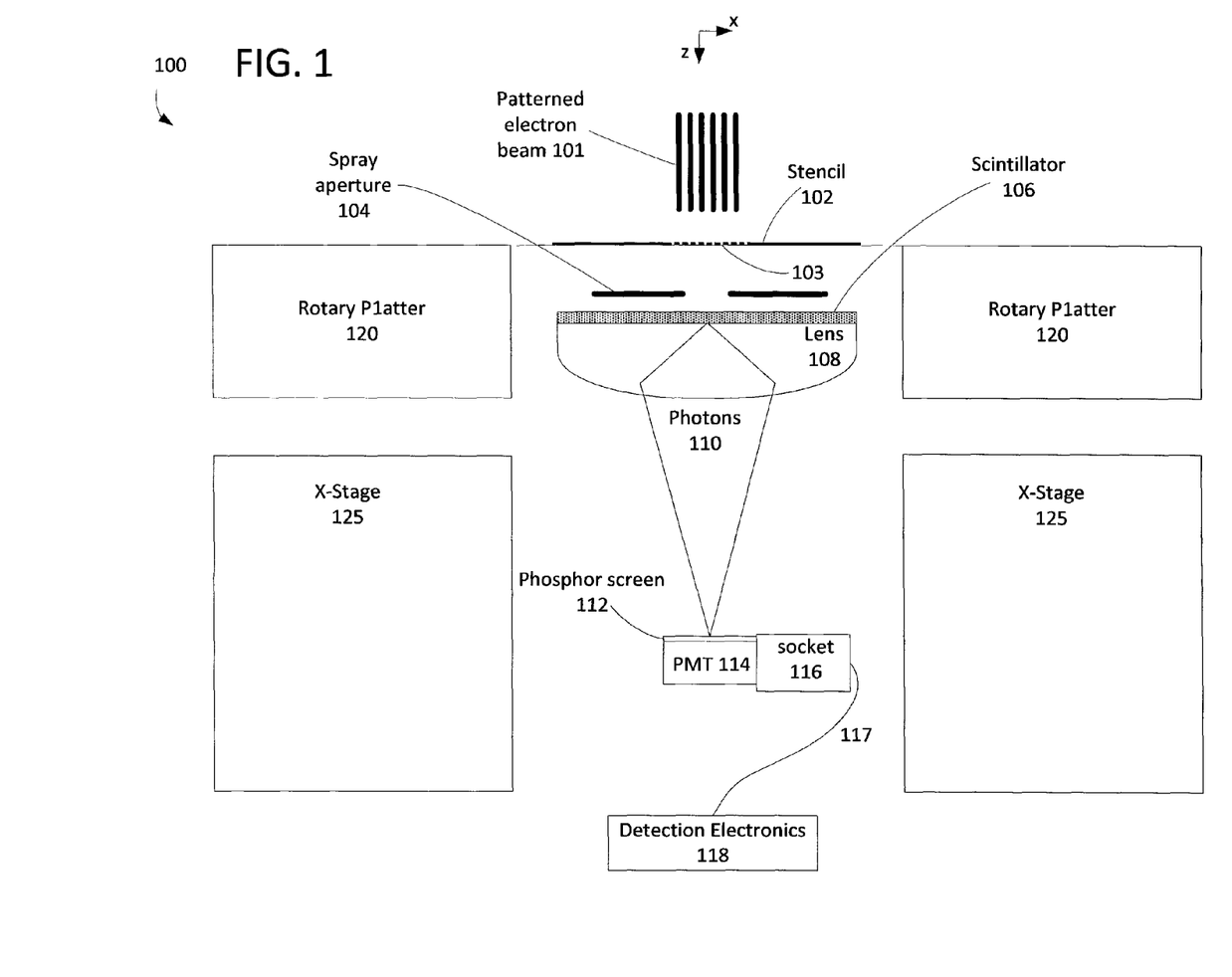
FIG. 1 is a cross-sectional diagram of an apparatus to detect the position of a patterned electron beam in accordance with a first embodiment of the invention.

FIG. 1 is a cross-sectional diagram of an apparatus 100 to detect the position of a patterned electron beam 101 in accordance with a first embodiment of the invention. The patterned electron beam 101 may be, for example, an electron beam patterned into lines or dots.

In relation to the example shown in FIG. 1, consider that the patterned electron beam 101 is patterned into lines that are normal to the plane of the page of FIG. 1 (i.e. the lines of the patterned electron beam 101 lie along the y-direction). In other words, the patterned electron beam 101 forms a striped pattern with lines lying along the y-direction (and spaced apart in the x-direction) when it impinges upon a flat surface in the x-y plane. The lines, and the spacing between them, for the patterned electron beam 101 may be one micron in width, for example. Other line and spacing widths may be used depending on the application.

As shown in FIG. 1, the apparatus 100 may be arranged such that the patterned electron beam 101 impinges upon a metal stencil 102 which is supported by a thin membrane 103. The membrane 103 may be made of silicon (Si), or other low Z material, and may be of a thickness of two microns, for example, so as to provide structural support for the stencil 102 while being largely transparent or semi-transparent to the electron beam 101.

The stencil 102 may be composed of a high Z material, such as molybdenum or platinum, for example, and may be a couple of microns thick, for instance. The thickness of the stencil 102 may depend, for example, on the energy of the electron beam and should be of a thickness to provide sufficient scattering of the beam.

In accordance with an embodiment of the invention, the stencil 102 may be patterned into lines that are normal to the plane of the page of FIG. 1 (i.e. the lines of the stencil 102 lie along the y-direction). In other words, similar to the patterned electron beam 101, the stencil 102 may have a striped pattern with lines lying along the y-direction (and spaced apart in the x-direction). The lines and the spacing between them for the stencil 102 may be one micron in width, for example. Other line and spacing widths may be used depending, for example, on the line and spacing widths of the patterned electron beam 101.

In one implementation, the striped pattern of the stencil 102 may have the same pitch as the patterned electron beam 101. As such, if the patterned electron beam 101 is properly aligned in the x-direction to the detector apparatus 100, then the lines of the patterned electron beam 101 will pass through (or mostly pass through) the spacing between the lines of the stencil 102. The patterned electron beam 101 will then pass through the opening of the spray aperture 104 so as to impinge upon the scintillator 106.

On the other hand, if the patterned electron beam 101 is not properly aligned in the x-direction to the detector apparatus 100, then the lines of the patterned electron beam 101 will be at least partially scattered by the lines of the stencil 102. The scattered electrons will then be deflected away from the z-axis such that it is blocked (or largely blocked) by the spray aperture 104 (instead of passing through the opening of the spray aperture 104). The spray aperture 104 may be formed of a high Z material, such as molybdenum or platinum, for example, and may be a couple of hundred microns thick, for instance.

The combination of the stencil 102 and the spray aperture 104 advantageously generates an effective contrast between aligned and misaligned signals. As the patterned electron beam 101 becomes closer to the proper alignment in the x-direction, it is expected that a larger fraction of the electrons in the beam 101 will impinge upon the scintillator 106. On the other hand, as the patterned electron beam 101 becomes further out of alignment in the x-direction, it is expected that a smaller fraction of the electrons in the beam 101 will impinge upon the scintillator 106.

The scintillator 106 may be made, for example, of a single crystal Yttrium-aluminum-garnet (YAG) plate. Other materials may also be used for the scintillator 106. The scintillator 106 converts the electrons that impinge upon it into photons 110. By converting the electron signal to photons 110, the detected signal will be of a form that is unaffected by magnetic and electric fields or changes in those fields.

An optical lens 108 may focus the photons 110 onto a phosphor screen 112 that is attached to a photomultiplier tube (PMT), photon counter, or other light detector 114. The lens 108 will preferably be of a material that has a high transmittance at the wavelength of photons 110 generated by the scintillator 106. The phosphor screen 112 receives the photons 110 and luminesces to generate a light signal that is received by the light detector 114. The type of light detector 114 used may depend on the electron-beam current, the anticipated intensity of the light signal from the phosphor screen 112, and the dynamic range required for the detection. The light detector 114 converts the light signal from the phosphor screen 112 into an electronic signal. A connection socket 116 and cable 117 may be configured to provide the electronic signal to detection electronics 118.

Figure 2:
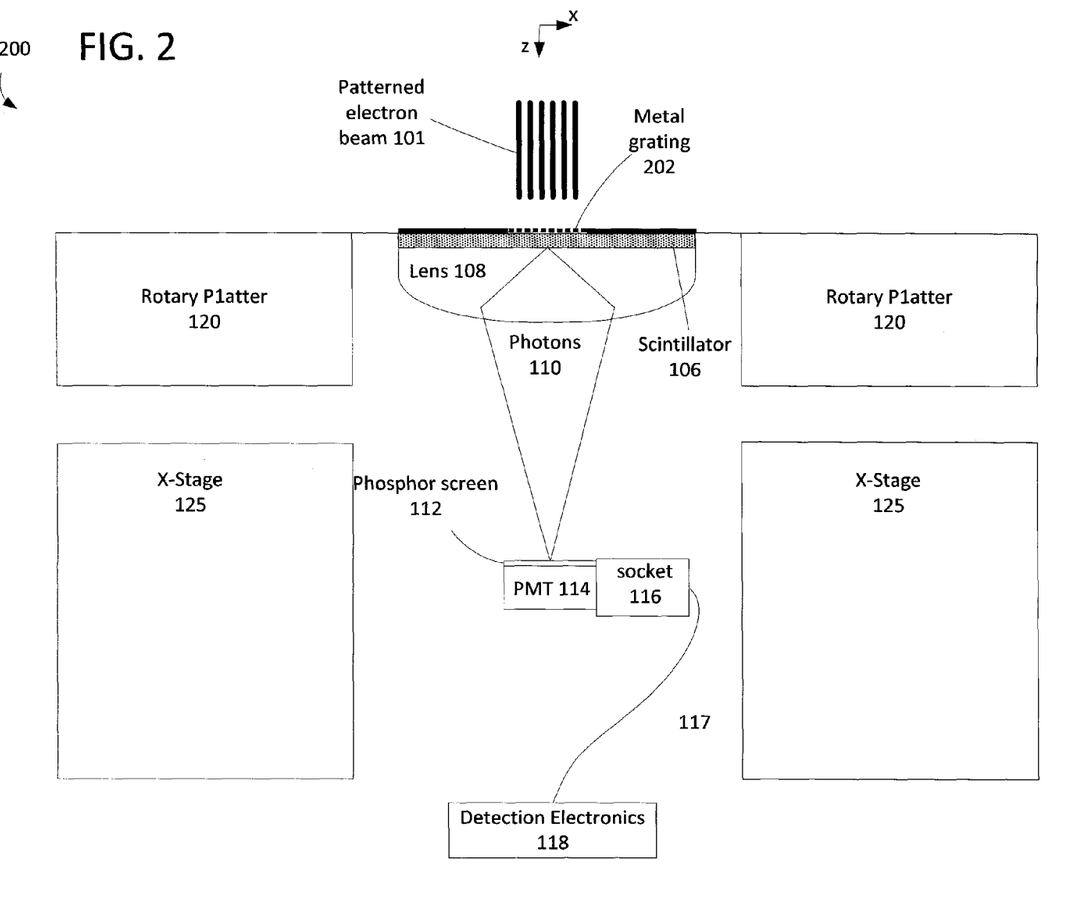
FIG. 2 is a cross-sectional diagram of an apparatus to detect the position of a patterned electron beam in accordance with a second embodiment of the invention.

FIG. 2 is a cross-sectional diagram of an apparatus 200 to detect the position of a patterned electron beam in accordance with a second embodiment of the invention. The components and their arrangement in the detection apparatus 200 of FIG. 2 are similar to the components and their arrangement in the detection apparatus 100 of FIG. 1.

However, in the detection apparatus 200 of FIG. 2, there is no need for the stencil 102, membrane 103, or spray aperture 104. Instead, a metal grating 202 may be fabricated directly on top of the substrate of the scintillator 106 using, for example, semiconductor manufacturing process technologies. The metal grating 202 may be made of tungsten, molybdenum, or platinum, for example, and may be of a thickness of two microns to block electrons of a 50 keV electron beam 101, for example. Other thicknesses may be used for the grating 202 in other implementations. The thickness of the grating 202 may depend, for example, on the grating material and the energy of the electron beam.

In one implementation, the striped pattern of the grating 202 may have the same pitch as the patterned electron beam 101. The lines, and the spacing between them, for the patterned beam 101 and for the grating 202 may be one micron in width, for example. Other line and spacing widths may be used depending on the application.

Figure 3:
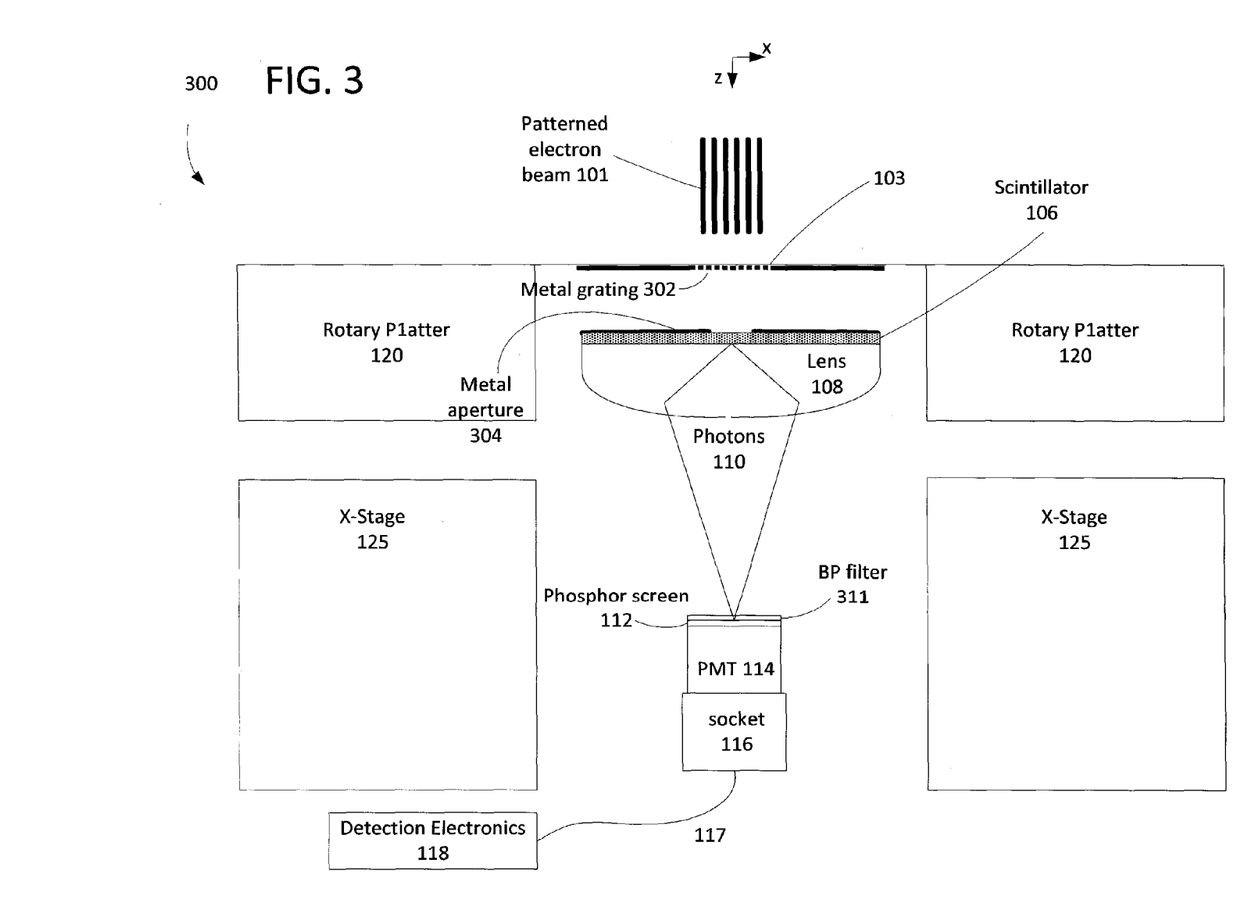
FIG. 3 is a cross-sectional diagram of an apparatus to detect the position of a patterned electron beam in accordance with a third embodiment of the invention.

FIG. 3 is a cross-sectional diagram of an apparatus to detect the position of a patterned electron beam in accordance with a third embodiment of the invention. The components and their arrangement in the detection apparatus 300 of FIG. 3 are similar to the components and their arrangement in the detection apparatus 100 of FIG. 1.

However, instead of a stencil 102 formed above the membrane 103 in the apparatus of 100 FIG. 1, a metal grating 302 is mounted on the underside of the membrane 103 in the apparatus 300 of FIG. 3. The metal grating 302 may be made of molybdenum or platinum, for example, and may be of a thickness of greater than twenty microns, for example, to block or scatter higher energy electrons. The thickness of the grating 302 may depend, for example, on the grating material and the energy of the electron beam. In one implementation, the striped pattern of the grating 302 may have the same pitch as the patterned electron beam 101. The lines and the spacing between them for the patterned beam 101 and for the grating 302 may be one micron in width, for example. Other line and spacing widths may be used depending on the application.

In addition, instead of a spray aperture 104 arranged between the stencil 102 and the scintillator 106 in the apparatus 100 of FIG. 1, a metal aperture 304 is formed directly on the scintillator 106 in the apparatus 300 of FIG. 3. Furthermore, the apparatus 300 of FIG. 3 may include a band-pass (BP) filter 311 in front of the phosphor screen 112 and may have its socket 116 attached to a bottom side of the PMT 114.

As shown in FIGS. 1-3, the detection apparatus (100, 200 and 300) may be mounted on a rotary platter 120. The rotary platter 120 may be magnetically floated or levitated above the X-Stage 125 and may be configured to spin about the z-axis. The X-Stage 125 is a mechanical stage that is configured to be controllably translated in the x-direction.

Conventional detection apparatus, such as a semiconductor electron detector or a Faraday cup to detect the electron signal directly, would be disadvantageous to mount on such a magnetically-floated spinning rotary platter 120. This is because the spinning rotary platter 120 generates magnetic fields that may interfere in a detrimental manner with the trajectory of the electron beam with the conventional detection apparatus. In contrast, the detection apparatus (100, 200 and 300) described above are each designed to operate in a robust manner in spite of the magnetic fields generated by the spinning rotary platter 120.

Figure 4:
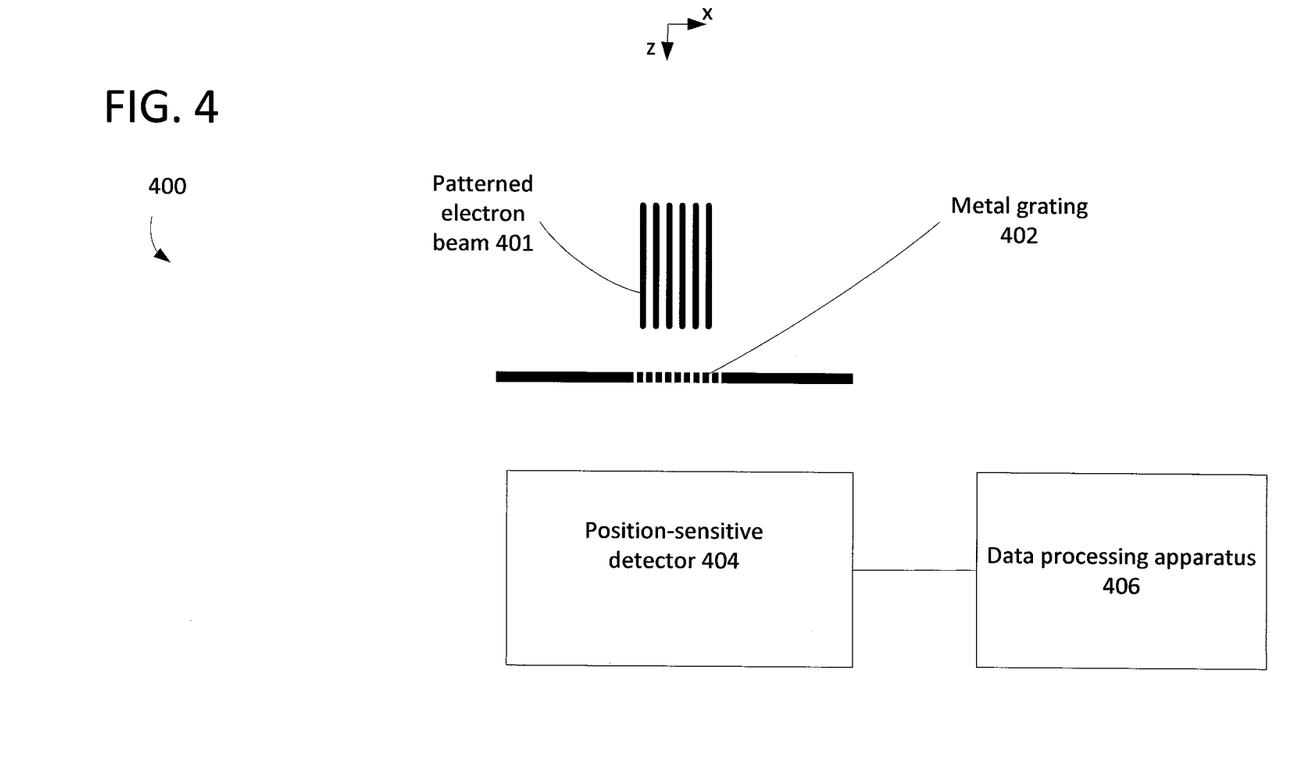
FIG. 4 is a cross-sectional diagram of an apparatus to detect the position of a patterned electron beam in accordance with a fourth embodiment of the invention.

FIG. 4 is a cross-sectional diagram of an apparatus 400 to detect the position of a patterned electron beam 401 in accordance with a fourth embodiment of the invention. The apparatus 400 includes a metal grating 402, a position-sensitive detector 404, and a data processing apparatus 406. The data processing apparatus 406 is configured to process the detected data from the position-sensitive detector 404.

In the illustrated embodiment, the patterned electron beam 401 and the metal grating 402 may comprise a pattern of lines along the y-direction that are spaced in the x-direction. In this embodiment, the position-sensitive detector 404 is position sensitive in the x-direction (and optionally also in the y-direction).

The metal grating 402 may be made of molybdenum or platinum, for example, and may be of a thickness of greater than twenty microns, for example, to block or scatter higher energy electrons. The thickness of the grating 402 may depend, for example, on the grating material and the energy of the electron beam.

The striped pattern of the grating 402 may have a pitch $p_2$ in the x-direction that is fractionally shorter than the pitch $p_1$ in the x-direction of the patterned electron beam 101. In other words, $p_2=p_1-\Delta p$, where $\Delta p$ is the difference between the pitches. As a result of this difference in pitch, a type of Moiré pattern is formed on the position-sensitive detector 404.

Figure 5:
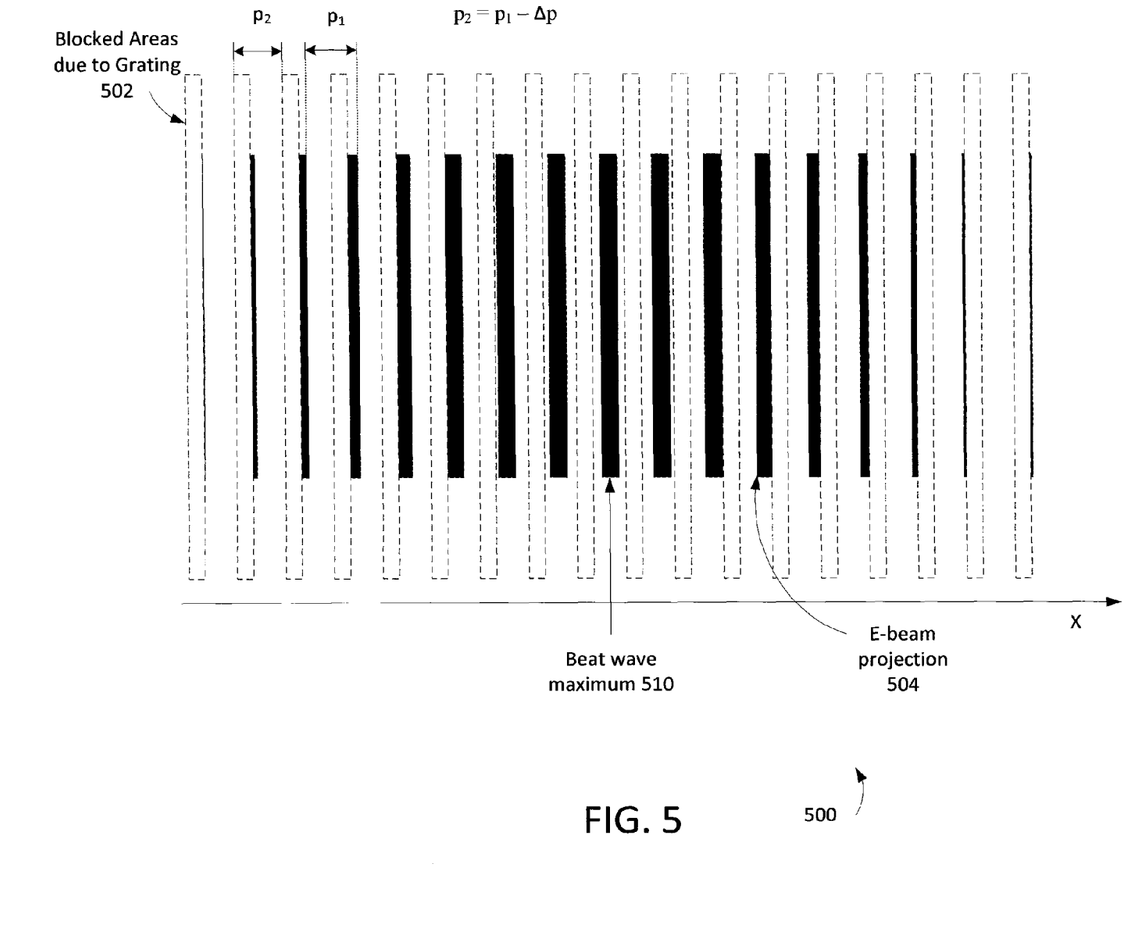
FIG. 5 depicts a first example of a Moiré pattern which may be detected by a position-sensitive detector in accordance with the fourth embodiment of the invention.

FIG. 5 depicts a first example of a Moiré pattern which may be detected on the detecting surface of the position-sensitive detector 404 in accordance with the fourth embodiment of the invention. Shown in FIG. 5 within the dashed rectangles are blocked areas 502. The blocked areas 502 correspond to areas and the detecting surface which are blocked from being illuminated by the electrons of the beam 401 because of the metal lines of the grating 402.

Also shown in FIG. 5 are solid black rectangles that show the projection 504 of the patterned electron beam 401 onto the detecting surface. Portions the patterned electron beam 401 that overlap with the blocked areas 502 are blocked from reaching the detecting surface. These blocked portions may be considered to be "hidden behind" the blocked areas 502.

The resultant projection 504 that does reach the detecting surface is in the form of a Moiré pattern. The Moiré pattern has a beat wave with a wavelength λ that is given below in Equation (1).

$$\lambda = 2p_1 p_2/(p_1-p_2) \approx 2p_1^2/\Delta p \quad (1)$$

In Equation (1), λ is the wavelength of the "beat wave", $p_1$ and $p_2$ are the pitches of the e-beam pattern and the grating, and $\Delta p = p_1 - p_2$.

While the resolution of the position-sensitive detector may make it difficult to resolve the individual lines of the e-beam projection 504, the beat wave of wavelength λ will be more readily visible in the detected data. In particular, a location in the x-direction of a maximum intensity 510 of the beat wave may be determined from the detected data. This location 510 corresponds to a phase location of the beat wave and indicates an alignment of the patterned electron beam 401 relative to the grating 402. An alignment or misalignment of the patterned electron beam 401 relative to the grating 402 may be determined from this phase information.

Figure 6:
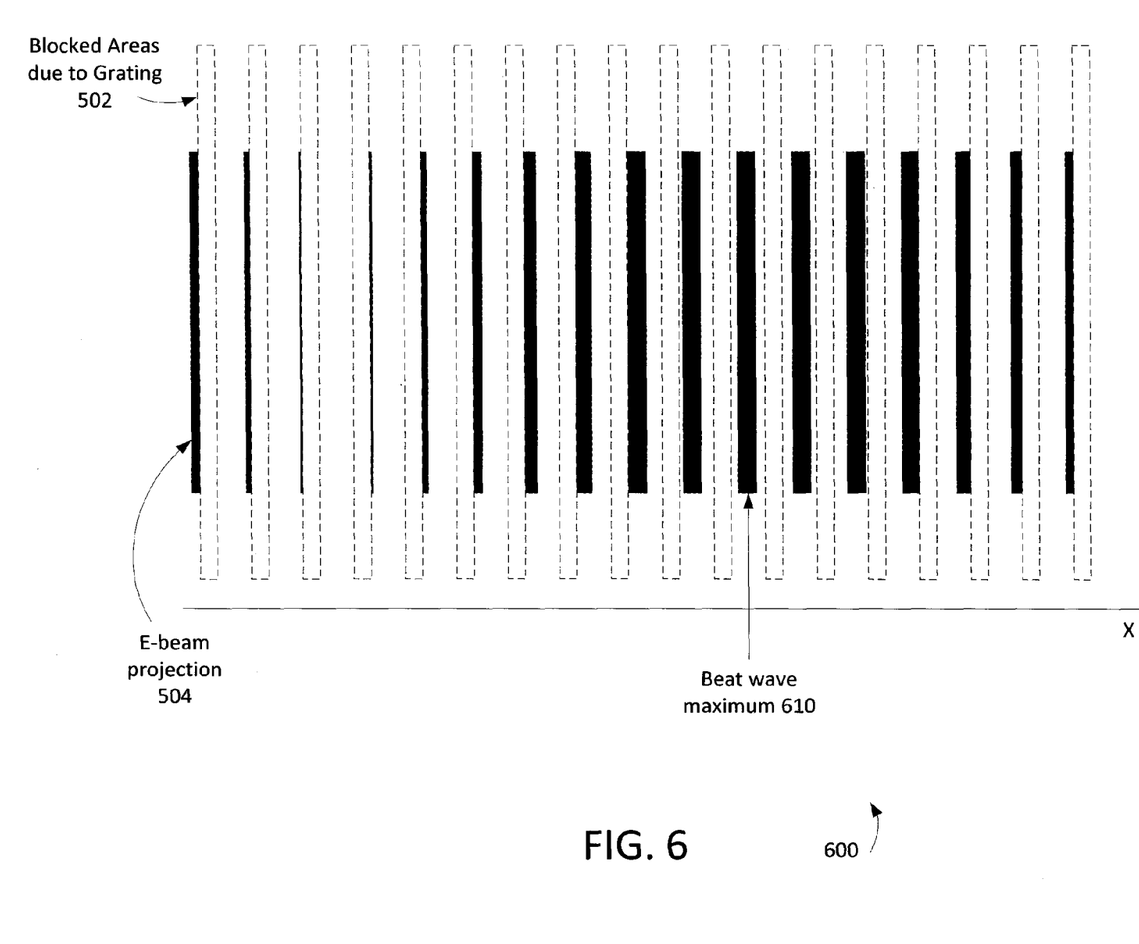
FIG. 6 depicts a second example of a Moiré pattern which may be detected by a position-sensitive detector in accordance with the fourth embodiment of the invention.

If the alignment of the patterned electron beam 401 relative to the grating 402 changes, then the phase location of the beat wave will shift. The beat wave after such a shift is depicted in FIG. 6. As seen, the beat wave maximum 610 in FIG. 6 has shifted relative to the beat wave maximum 510 of FIG. 5.

The apparatus (100, 200, and 300) described above in relation to FIGS. 1-3 are designed to have the same pitches for the e-beam 101 and the stencil and/or grating. However, a small difference between these pitches would cause the brightness of the phosphor screen to vary as the e-beam is swept across the grating. This may cause inaccuracies in the measurement. In contrast, using the apparatus 400 of FIG. 4 to detect the positioning of Moiré patterns as described above takes purposeful advantage of a small difference in pitch to determine misalignment.

Applicants contemplate that a fixed microscope may be used as a reference point. Alternatively, two Moiré patterns, one with the longer pitch on the bottom, and the other with the longer pitch on the top, may be used to cross-reference the misalignment. The phase difference between the beat wavelengths of the two patterns may be proportional to the misalignment.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for detecting a patterned electron beam, the apparatus comprising:
   a grating with a pattern that has a same pitch as the patterned electron beam; and
   a scintillator for detecting electrons of the patterned electron beam that pass through the grating.

2. The apparatus of claim 1, wherein the grating comprises a stencil attached to a membrane.

3. The apparatus of claim 1, wherein the grating is attached to the scintillator.

4. The apparatus of claim 1 further comprising:
   an optical lens configured to focus photons emitted from the scintillator; and
   a light detection system configured to detect the photons.

5. The apparatus of claim 4, wherein the light detection system comprises:
   a phosphor screen configured to receive the photons focused by the optical lens and generate a light signal which depends on the photons received; and
   a light detection device which is configured to convert the light signal to an electronic signal.

6. The apparatus of claim 5, wherein the light detection device comprises a photomultiplier tube.

7. The apparatus of claim 1 further comprising:
   a spray aperture arranged between the grating and the scintillator.

8. The apparatus of claim 1 further comprising:
   a rotary platter that is magnetically levitated over a mechanical stage.

9. A method of detecting a patterned electron beam, the method comprising:
   focusing the patterned electron beam onto a grating with a pattern that has a same pitch as the patterned electron beam; and
   detecting electrons of the patterned electron beam that pass through the grating un-scattered.

10. The method of claim 9, further comprising:
    blocking electrons of the patterned electron beam that are scattered by the grating.

11. The method of claim 10 further comprising:
    generating a photon signal that depends on the detected electrons; and
    converting the photon signal to an electronic signal.

12. The method of claim 9, wherein the grating is coupled to a rotary platter, and further comprising:
    magnetically levitating the rotary platter over a mechanical stage; and
    rotating the rotary platter.

13. An apparatus for detecting a patterned electron beam, the apparatus comprising:
    a grating with a pattern that has a second pitch that is different than a first pitch of the patterned electron beam; and
    a position-sensitive detector for detecting electrons of the patterned electron beam that pass through the grating.

14. The apparatus of claim 13, wherein a Moiré pattern is formed on the position-sensitive detector.

15. The apparatus of claim 14 further comprising:
    a data processing apparatus that is configured to determine a phase position of the Moiré pattern.

16. The apparatus of claim 15, wherein the data processing apparatus is further configured to use the phase position of the Moiré pattern to determine an alignment of the patterned electron beam relative to the grating.

17. A method of detecting a patterned electron beam, the method comprising:
focusing the patterned electron beam onto a grating with a pattern that has a second pitch that is different than a first pitch of the patterned electron beam; and
using a position-sensitive detector to detect electrons of the patterned electron beam that pass through the grating.

18. The method of claim 17, wherein a Moiré pattern is formed on the position-sensitive detector.

19. The method of claim 18 further comprising:
determining a phase position of the Moiré pattern.

20. The method of claim 19 further comprising:
using the phase position of the Moiré pattern to determine an alignment of the patterned electron beam relative to the grating.

* * * * *